United States Patent [19]

Glass

[11] Patent Number: 4,624,901
[45] Date of Patent: Nov. 25, 1986

[54] INTERMEDIARY LAYERS FOR EPITAXIAL HEXAGONAL FERRITE FILMS

[75] Inventor: Howard L. Glass, Orange, Calif.

[73] Assignee: Rockwell International Corporation, El Segundo, Calif.

[21] Appl. No.: 720,202

[22] Filed: Apr. 4, 1985

[51] Int. Cl.$^4$ .......................... C04B 35/00; B32B 9/00; B32B 19/00
[52] U.S. Cl. .................................... 428/469; 428/700; 428/701; 428/471; 428/472; 156/600; 156/624
[58] Field of Search ............... 428/700, 701, 688, 699, 428/469, 471, 472; 156/600, 624

[56] References Cited

U.S. PATENT DOCUMENTS

| | | | |
|---|---|---|---|
| 3,535,200 | 10/1970 | Bergstrom | 428/701 X |
| 4,189,521 | 2/1980 | Glass et al. | 428/539 |
| 4,293,372 | 10/1981 | Glass | 156/624 |
| 4,355,072 | 10/1982 | Mateika et al. | 428/700 X |
| 4,429,052 | 1/1984 | Mateika et al. | 501/135 |

OTHER PUBLICATIONS

H. L. Glass et al., "Growth of Hexagonal Ferrite Films by Liquid Phase Epitaxy", IEEE Trans. Mag. MAG-13, (1977) 1241.
F. S. Stearns et al., "Liquid Phase Epitaxy of Hexagonal Ferrites and Spinel Ferrites on Non-Magnetic Spinel Substrates", Mat. Res. Bull. 11 (1976) 1319.
S. L. Blank et al., "The Growth of Magnetic Garnets by Liquid Phase Epitaxy", J. Crystal Growth 17 (1972) 302.
E. A. Giess et al., "Liquid Phase Epitaxial Growth of Magnetic Garnet Films by Isothermal Dipping in a Horizontal Plane with Axial Rotation", J. Crystal Growth 16 (1972) 36.
H. Dotsch et al., "Growth and Properties of Epitaxial Barium Hexaferrite Films", Mat. Res. Bull. 18 (1983) 1209.
F. Haberey et al., "Preparation and Magnetic Properties of LPE-Grown Hexagonal Strontium Aluminoferrite Films", Mat. Res. Bull. 15 (1980) 493.
H. L. Glass et al., "LPE Growth of Magnetoplumbite and Lithium Ferrite from PbO-$B_2O_3$ Flux", Proc. Int. Conf. Ferrites, Sep.-Oct. 1980, Japan, p. 39.
J. M. Robertson et al., "Growth of Spinel Ferrite Films by Liquid Phase Epitaxy", J. Crystal Growth 41 (1977) 29.
P. J. M. van der Straten et al., "LPE Growth and Magnetic Anisotropy of Ni(Fe,Al)$_2$O$_4$ Films", J. Crystal Growth 51 (1981) 119.
P. J. M. van der Straten et al., "Liquid Phase Epitaxial Growth of Lithium Ferrite-Aluminate Films", J. Crystal Growth 48 (1980) 113.
J. P. M. Damen et al., "Thin Film Growth of (Mn$_x$Zn$_{1-x}$)Fe$_2$O$_4$ by Liquid Phase Epitaxy on Bridgman Grown Zn$_2$TiO$_4$ Substrates", J. Crystal Growth 47 (1979) 486.

Primary Examiner—Nancy A. B. Swisher
Attorney, Agent, or Firm—H. Fredrick Hamann; George A. Montanye

[57] ABSTRACT

A single crystal film of a hexagonal ferrite is deposited on a nonmagnetic, single crystal substrate with a film of a second ferrite material interposed between the substrate and the hexagonal ferrite film. In a preferred embodiment, the substrate is of nonmagnetic spinel and the second ferrite material is a spinel ferrite.

14 Claims, No Drawings

INTERMEDIARY LAYERS FOR EPITAXIAL HEXAGONAL FERRITE FILMS

This invention was made with Government support under Contract No. F19628-83-C-0132 awarded by the Air Force. The Government has certain rights in this invention.

BACKGROUND OF THE INVENTION (1) Field of the Invention

This invention is in the field of single crystal ferrite films and more particularly pertains to single crystal films of hexagonal ferrite deposited on single crystal, nonmagnetic substrates.

(2) Description of the Related Art

Ferrites are ferrimagnetic oxides. On the basis of the atomic arrangements of their crystalline structures, several classes of ferrites may be defined. Three important classes are: spinel ferrites, garnet ferrites and hexagonal ferrites. Using the descriptions of Wyckoff, the corresponding atomic arrangements of these three classes of ferrites are: spinel, garnet, and beta-alumina, respectively.

Spinel, as described by R. W. G. Wyckoff, "Crystal Structures," 2nd Ed., Interscience Publishers, New York (1965), Vol. 3, pp. 75–83, is any crystalline substance having the atomic arrangement of the mineral spinel (magnesium aluminum oxide) or having certain variations of that atomic arrangement. Examples of spinels are: magnesium aluminum oxide, magnesium gallium oxide (abbreviated MGS), magnesium gallium oxide with partial substitution of indium for gallium (abbreviated MIGS) and zinc gallium oxide (abbreviated ZGS). Other examples include the spinel ferrites.

Spinel ferrites are any ferrimagnetic oxide spinels. One example is the mineral magnetite, also known as loadstone or as ferrous ferrite, an oxide of iron. Among the many other examples are zinc ferrite, which is an oxide of iron and zinc, and lithium ferrite, which is an oxide of iron and lithium. Spinel ferrites were the first class to be widely studied and used. Therefore, the term ferrite is sometimes used without any descriptive adjective to mean spinel ferrite. This is particularly true in the older literature.

Garnet, as described by Wyckoff (pp. 222–225), is any crystalline substance having the atomic arrangement of the silicate materials known as garnets. An important example is gadolinium gallium garnet (abbreviated GGG), an oxide of gadolinium and gallium. Other examples include garnet ferrites.

Garnet ferrites are any ferrimagnetic oxide garnets. An important example is yttrium iron garnet (abbreviated YIG). Other important examples include modified YIG; that is, YIG with other chemical elements substituted for some of the yttrium and/or some of the iron.

Beta-alumina, as described by Wyckoff (pp. 496–499), is any crystalline substance having the atomic arrangement of the sodium aluminum oxide compound known as beta-alumina or having certain variations of that atomic arrangement. Examples include barium hexagallate, strontium hexagallate, the nonmagnetic hexagonal mixed crystal substrates defined in U.S. Pat. No. 4,429,852, and all hexagonal ferrites.

Magnetoplumbite is the lead iron oxide compound having the formula $PbO.6Fe_2O_3$. This compound is also known as lead hexaferrite. Magnetoplumbite also is the name of the mineral that is substantially identical to lead hexaferrite. Sometimes the term magnetoplumbite is used to describe the particular variation of the beta-alumina atomic arrangement that lead hexaferrite possesses.

Hexagonal ferrites are any ferrites having beta-alumina atomic arrangements. The simplest examples are magnetoplumbite and its barium and strontium analogs, barium hexaferrite and strontium hexaferrite. These are described in Wyckoff along with a few hexagonal ferrites having more complicated formulas. The various hexagonal ferrites are described in more systematic terms in W. H. von Aulock ed., "Handbook of Microwave Ferrite Materials," New York, Academic Press (1965), (Section IV), J. Smit and H. P. J. Wijn, "Ferrites," New York, John Wiley & Sons (1959), (mainly in Chapter IX) and in J. A. Kohn et al., "Crystallography of the Hexagonal Ferrites," Science 172 (1971) 519. Some of the simpler hexagonal ferrites are represented by a shorthand notation. Thus, lead, barium and strontium hexaferrite are abbreviated as PbM, BaM and SrM, respectively. The use of the letter M seems to have arisen from the magnetoplumbite atomic arrangement of these particulaar hexagonal ferrites. Other hexagonal ferrites are denoted by the letters W, X, Y and Z. Each of these has a specific stoichiometry and atomic arrangement.

Hexagallates and hexa-aluminates are oxide compounds similar in atomic arrangement and stoichiometry to the M-type hexagonal ferrites but having the iron replaced by gallium and aluminum, respectively.

In some applications it is advantageous or necessary that the ferrite be in the form of a single crystal thin film. Usually, single crystal films are prepared by epitaxial deposition; the crystallographically oriented growth of a crystal onto the surface of a substrate crystal. It is often possible to achieve epitaxy (oriented growth) even when the film and the substrate are quite dissimilar. In such cases, however, the film usually has many defects. Experience has shown that the substrate should be a single crystal that is lattice matched to the film and that has a low defect density if film defects are to be avoided. Lattice matching refers to similar crystal structure and equal, or nearly equal, interatomic dimensions in film and substrate.

In the case of YIG and related garnet ferrites, an LPE (liquid phase epitaxy) process has been developed for the growth of single crystal thin films. This process is in commercial use. Usually the substrate is a carefully prepared single crystal wafer of GGG. Thus, film and substrate have the same basic crystal structure, garnet. The exact chemical composition of the garnet ferrite film is chosen (in part) so the interatomic spacings (the crystal lattice constant) of film and substrate are closely matched. Under these conditions, single crystal garnet ferrite films that are nearly free of defects have been grown over the range of film thicknesses from less than 1 micrometer to more than 100 micrometers.

Experience with the garnet ferrites has shown that defect free films can be grown even when the lattice matching is not exact. The deviation from matching may be described by the misfit; that is, the difference between film and substrate lattice constants expressed as a fraction or as a percent. For the garnet ferrites, defect free films having useful properties have been reported for misfit values well in excess of 0.1% and for both signs of misfit (that is, with lattice constant of film either greater than or less than that of the substrate).

When the misfit is not zero, defect free films will experience stresses. These stresses can produce desirable effects. For example, the stress can produce desired values of magnetic anisotropy. If the stresses are large, then defects may form under certain conditions. For example, if the film has a smaller lattice constant than the substrate, then there will be a critical film thickness beyond which the film will tend to crack. If the film has a larger lattice constant than the substrate, then dislocations and similar defects may form if the material is subjected to high temperatures.

If the misfit is several tenths of a percent, then it may not be possible to obtain defect free films. For these larger values of misfit, even very thin films may be cracked if the sign of the misfit is such that the film has the smaller lattice constant. However, if the misfit is of opposite sign, uncracked films exhibiting a defect known as faceting can be obtained. Faceted films are epitaxial and can be used in certain applications. For example, it has been suggested that such films will be useful in certain optical memory devices since the defects stabilize the magnetic domain walls.

If the misfit is excessive, then it may not be possible to deposit a film at all. For LPE of garnet ferrites, it has been reported that this occurs when the misfit exceeds 1.5%.

These various effects of misfit are reasonably well understood in a qualitative sense. There also is a reasonably good quantitative understanding of certain specifics such as the existence of a critical thickness for crack formation when the film has the smaller lattice constant. However, in general, the influence of misfit is difficult to understand in detail. It is not possible to predict with accuracy the range of misfit values over which epitaxy can be achieved for a given combination of film and substrate and a given film deposition process.

Outside the realm of garnet ferrites, there is evidence that epitaxy can be achieved even when the misfit is quite large. In some cases, useful materials are obtained. For example, epitaxy of silicon is obtained on yttria stabilized cubic zirconia in spite of a misfit of several percent. The quality of the silicon is similar to (in some respects better than) silicon films on sapphire. Silicon on sapphire is in use for integrated circuits. Thus the silicon quality is sufficiently good for electronic devices in spite of a misfit of approximately 10%. (Silicon on sapphire is also interesting because the film and substrate are quite dissimilar. Thus, the lattice matching requirement for epitaxy does not necessarily mean that film and substrate must have the same crystal structure.)

Single crystal thin films of hexagonal ferrite deposited on nonmagnetic substrates have many potential applications, especially for several kinds of ferrite components for millimeter wave systems. As indicated above, the most commonly used approach toward preparing single crystal films is epitaxy, the crystallographically oriented growth of a crystalline substance on a crystalline substrate.

Several investigators have reported the epitaxial growth of various hexagonal ferrites on various nonmagnetic substrates.

H. Dotsch et al., "Growth and Properties of Epitaxial Barium Hexaferrite Films," Mat. Res. Bull. 18 (1983) 1209, reported the growth of barium hexaferrite on Zr and Mg substituted strontium hexagallate substrates. The deposition method was LPE (liquid phase epitaxy) using a solvent comprising bismuth oxide and boron oxide. The films contained some bismuth (from the solvent) and some platinum (from the crucible). F. Haberey et al., "Preparation and Magnetic Properties of LPE-Grown Hexagonal Strontium Aluminoferrite Films," Mat. Res. Bull. 15 (1980) 493, reported the growth of Al and Pb substituted strontium hexaferrite on unsubstituted strontium hexagallate substrates by a modified LPE method. The solvent contained lead oxide which evaporated during the deposition process. H. Glass et al., "LPE Growth of Magnetoplumbite and Lithium Ferrite from $PbO-B_2O_3$ Flux," Proc. Int. Conf. Ferrites, Sept.-Oct. 1980, Japan, p. 39, reported LPE growth of lead hexaferrite on gallate spinel substrates. They also have reported growth of barium hexaferrite and other barium-based hexagonal ferrites on gallate spinel substrates. See H.L. Glass et al., "Growth of Hexagonal Ferrite Films by Liquid Phase Epitaxy," IEEE Trans. Mag., MAG-13 (1977) 1241.

In all of the prior art, the hexagonal ferrite films exhibit various types of surface irregularities: islands, fish-scales, steps and terraces. The smoothest films were those reported by Dotsch et al. These films were covered with terraces 10 nm high punctuated by larger hexagonal scales. Closer examination revealed that the films initially deposited as hexagonal islands that grew together. Glass et al. also have shown this kind of island growth. See U.S. Pat. No. 4,189,521.

Gallate spinels can provide good lattice matching with small (or zero) misfit for epitaxial hexagonal ferrites. This is true because the spinel crystal structure is very similar to the magnetoplumbite and related structures of the hexagonal ferrites and because the chemical composition of the spinel can be chosen to provide a wide range of lattice constants. The structural relationship between spinel and hexagonal ferrites is clearly seen when the hexagonal ferrite structures are described in terms of the R, S, and T blocks. These blocks are parallel to the basal plane of the hexagonal ferrite crystal. All of the hexagonal ferrite crystal structures can be described in terms of various stacking sequences of these blocks.

The S block is common to all hexagonal ferrites and has a structure identical to spinel. This is most clearly seen when the spinel crystal is viewed in the [111]direction. Then spinel is seen to consist of a close-packed stack of hexagonal-close-packed planes of oxygen atoms. The metal atoms in spinel fit in the interstices between the planes of oxygen atoms The hexagonal ferrites also consist essentially of close-packed stacks of hexagonal-close-packed planes of oxygen atoms with metal atoms in the interstices. These close-packed planes are parallel to the basal plane in the hexagonal crystal structure. The R and T blocks are quite similar in structure to the S block; the most notable difference being that in the R and T blocks a small fraction of the sites in the close-packed oxygen planes are occupied by Ba or Sr or Pb instead of by oxygen atoms.

In addition to the structural similarity, the interatomic spacings in spinel can be adjusted to match those of a particular hexagonal ferrite. This is done by choosing the chemical composition of the spinel; that is, by choosing the particular metal atoms that occupy the interstitial sites within the oxygen framework. This is analogous to the case of garnet ferrites where, for example, YIG is grown epitaxally on GGG. YIG and GGG both have the same oxygen framework (possibly with a small misfit) but the metal atoms are completely different. Thus, ZGS has a lattice constant such that there is nearly zero misfit for barium hexaferrite and in MIGS the indium content can be chosen to match any of several hexagonal ferrites including barium hexaferrite.

Obviously, spinel substrates of suitable lattice constant should also be lattice matched to spinel ferrites. In fact, Glass et al., P. J. M. van der Straten et al., "LPE Growth and Magnetic Anisotrophy of Ni(Fe, Al)$_2$O$_4$ Films," J. Crystal Growth 51 (1981) 119, and "Liquid Phase Epitaxial Growth of Lithium Ferrite-Aluminate Films," J. Crystal Growth 48 (1980) 114, J. P. M. Damen et al., "Thin Film Growth of (Mn$_x$Zn$_{1-x}$)Fe$_2$O$_4$ by Liquid Phase Epitaxy on Bridgman Grown Zn$_2$TiO$_4$ Substrates," J. Crystal Growth 47 (1979) 486, and F. S. Stearns et al., "Liquid Phase Epitaxy of Hexagonal Ferrites and Spinel Ferrites on Non-Magnetic Spinel Substrates," Mat. Res. Bull. Vol. 11, pp 1319-1326, 1976, have reported LPE growth of spinel ferrites on spinel substrates. Included in this prior art are examples of the growth of lithium ferrite on ZGS and MIGS. One observed difference between LPE of spinel ferrites and garnet ferrites is that spinel ferrites tend to produce an appreciable interdiffusion layer at the surface between the ferrite film and the spinel substrate.

Another substrate that has been used successfully to deposit epitaxial films of several different spinel ferrites is MgO. It has the NaCl cubic crystal structure. The lattice constant is one half that of many spinel ferrites, so good lattice matching is possible. As examples, J. M. Robertson et al., "Growth of Spinel Ferrite Films by Liquid Phase Epitaxy," J. Crystal Growth 41 (1977) 29, reported the growth of epitaxial magnesium ferrite and nickel-zinc ferrites on (111) oriented MgO. They found that the films had pronounced terraces when the substrates were misoriented from (111) by about two degrees but the films were smooth when the misorientation was less than 0.1 degree. There are no known reports of epitaxial growth of hexagonal ferrites on MgO.

There does not appear to be any reference in the prior art to epitaxy of spinel ferrite on beta-alumina substrates. In view of the close similarity of the crystal structure, as described above, beta-aluminas should satisfy the lattice matching requirements for at least some spinel ferrites. If the beta-alumina structure is truly hexagonal, spinel ferrite films grown on this substrate may exhibit twinning, since spinel has a three-fold symmetry around the [111]direction. This phenomenon could limit the usefulness of beta-aluminas as substrates for spinel ferrites.

The prior art provides little information on the effects of misfit on the epitaxial growth of hexagonal ferrites. Glass et al. have described growth of a barium hexaferrite from an LPE solution that contained lead oxide and zinc oxide onto three different spinel substrates. The substrates were MIGS of lattice constant 8.305 angstrom, MGS of lattice constant 8.290 angstrom and magnesium aluminum oxide spinel of lattice constant 8.083 angstrom. Exact lattice matching of the spinel (111) planes to barium hexaferrite basal planes would occur at a spinel lattice constant of 8.334 angstrom (at room temperature). Epitaxial (island) growth of hexagonal ferrite was obtained for all three substrates; however, with the magnesium aluminum oxide spinel, there were fewer islands and their surfaces were not as smooth. Also, for the aluminate substrate, X-ray diffraction peaks of the hexagonal ferrite were broader than for the MGS or MIGS. These results show that epitaxial hexagonal ferrite can be deposited on the aluminate spinel for which the misfit is 3.0%; however, the quality of the hexagonal ferrite was not as good as for the gallate spinel substrates for which the misfit was 0.3% or 0.5%. In all these cases the substrate lattice constant was less than the ideal value of 8.334 angstrom Glass et al. have also reported epitaxial growth of hexagonal ferrites on MIGS substrates having lattice constants as large as 8.381 angstrom and on ZGS substrates that have lattice constants very close to 8.334 angstrom.

Although lattice matching is an important necessary condition for epitaxy, it is not a sufficient condition. Moreover, even when the lattice matching condition is satisfied and epitaxy is achieved, film quality may be poor. There are other conditions that must be met. Some of these conditions may be unknown. In general, the suitability of a particular substrate can be determined only by experiment.

In the prior art, all LPE hexagonal ferrite films on nonmagnetic substrates have surface irregularities. This is true of growth on both gallate spinel and hexagallate substrates. However, Stearns et al. have shown that hexagonal ferrites can be used as substrates; for example, they grew epitaxial films of W-type hexagonal ferrite on substrates of M-type. Since the LPE method is very similar to the flux method that is used to grow bulk crystals of hexagonal ferrites and since such bulk crystals can have rather good surfaces, it should be possible to obtain surface quality similar to that of bulk crystals when LPE hexagonal ferrites are grown on hexagonal ferrite substrates. The disadvantage of this approach is that in many cases it is important that the substrate be nonmagnetic.

Besides surface smoothness, ferromagnetic resonance linewidth is an important indicator of the quality of hexagonal ferrite films. The linewidth is directly related to key parameters in device performance For example, the linewidth determines the width of the passband in filter applications. Based on theory and experiments, YIG is expected to have a linewidth of 1 or 2 Oe at frequencies in the vicinity of 60 GHz. Dotsch et al. report that the smallest measured value for the linewidth of spheres fabricated from bulk crystals of barium hexaferrite is 16 Oe at 60 GHz. They report a value of 45 Oe at 53 GHz for their best LPE hexagonal ferrite film. However, the 45 Oe value is an inferred value, not a measured value. The measured ferromagnetic resonance peak was asymmetric and had a width of 62 Oe. The 45 Oe value was deduced by attributing the asymmetry to the presence of unresolved higher order modes and assuming that the linewidth characteristic of the material itself could be obtained by doubling the width of the narrower half of the resonance peak.

Dotsch et al. also report a value of 11.56 KOe for the internal field arising within the hexagonal ferrite itself. From work on bulk crystals they expected a value about 1 KOe larger.

In LPE growth, once the substrate surface is completely covered with an epitaxial film of hexagonal ferrite, subsequent growth is virtually identical to the growth of a bulk hexagonal ferrite crystal. Therefore, LPE hexagonal ferrites should have a quality at least as good as bulk hexagonal ferrite crystals, provided that the substrate is of good quality and provided that the epitaxial film that initially covers the substrate surface is of good quality. The prior art shows, however, that the initial hexagonal ferrite deposit consists of individual islands that grow together. Thus, the initial epitaxial film is not uniform and the hexagonal ferrite that subsequently grows on top of this initial film is inferior in quality to the best bulk hexagonal ferrite crystals.

Actually, if the problem of providing a uniform initial hexagonal ferrite film of high quality can be solved, LPE hexagonal ferrites should be superior in quality to bulk hexagonal ferrite crystals because the LPE process provides growth under conditions that are more uniform and more controllable than bulk growth conditions. For example, LPE growth may be carried out at constant temperature, and, in LPE growth, only a small mass of crystal is formed so that the composition of the liquid phase and the growth rate are virtually constant. Furthermore, epitaxial hexagonal ferrite films have other advantages over bulk crystals such as ease of fabrication, a factor that is especially important in applications that require ferrite in the form of thin single crystals. LPE also offers advantages in preparing ferrites having tailored magnetic properties; for example, modifying the composition or preparing multiple layers of differing composition. These advantages have been amply illustrated in the prior art of LPE garnet ferrites.

SUMMARY OF THE INVENTION

It is an object of this invention to provide a relatively uniform and defect-free LPE film of a selected hexagonal ferrite on a single crystal, nonmagnetic substrate lattice matched to the hexagonal ferrite.

The invention is accomplished by initially treating the surface of a selected single crystal, nonmagnetic substrate to more closely resemble that of a lattice matched hexagonal ferrite crystal. In this way, the initial stages of epitaxial growth of the hexagonal ferrite are made more similar to bulk crystal growth; that is, the substrate surface is made to appear less foreign to the depositing hexagonal ferrite film.

As a consequence, the hexagonal ferrite film that initially deposits on the substrate will be more uniform than if the nonmagnetic substrate were used with its untreated surface. The improved quality of the initial film will result in an improved quality of the subsequently deposited film.

In order to make the surface of the nonmagnetic substrate resemble more closely the surface of a hexagonal ferrite crystal, an epitaxial film of a different ferrite is first deposited directly on the non-magnetic substrate. A spinel ferrite is perferred. Since spinel ferrite has the spinel structure which is very similar to the crystal structure of hexagonal ferrites, lattice matching conditions are maintained. Moreover, since the spinel ferrite is a ferrite, its chemistry is more similar to the hexagonal ferrite than is the chemistry of the nonmagnetic substrate itself. This chemical matching combined with lattice matching appears to result in more uniformity in a subsequently deposited epitaxial hexagonal ferrite film than does lattice matching without chemical matching.

In many applications, the material that is desired is a single crystal film of hexagonal ferrite on a nonmagnetic substrate. This invention interposes an intermediary transition layer of spinel ferrite between the hexagonal ferrite and the nonmagnetic substrate. When this intermediary layer is thin compared to the hexagonal ferrite layer and the substrate, then the magnetic effects of the intermediary layer will be insignificant in most cases. Moreover, the magnetic properties of hexagonal ferrites generally are much different from those of spinel ferrites. For example, in applications in which ferromagnetic resonance is used, operation of the device at or near resonance of the hexagonal ferrite film will correspond to operation very far off resonance for the spinel ferrite; thus, the spinel ferrite intermediary layer will not produce significant effects. On the other hand, it is possible to conceive of applications in which the spinel ferrite intermediary layer (perhaps of appreciable thickness) is an active part of the device. For example, it is possible to have a material with two resonance peaks, one at the resonance frequency of the hexagonal ferrite and one at the resonance frequency of the spinel ferrite.

The exact chemical composition of the spinel ferrite probably is not important, since all are chemically quite similar. The composition will affect the lattice constant and, therefore, lattice matching. However, experience with garnet ferrites shows that, if misfit is not accommodated by defects and if the epitaxial films are thin compared to the substrate, then each film in a multiple film structure will conform to the lattice dimensions imposed by the substrate. The only concern is that the combination of misfit and thickness of the intermediary transition layer spinel ferrite not result in defects or cracks.

It has been pointed out that, in the absence of defects to accommodate misfit, each film in a multiple film structure will conform to the lattice dimensions imposed by the substrate. In other words, the films are elastically deformed to match the substrate. This is an example of a phenomenon known as pseudomorphism. Pseudomorphism is frequently observed in epitaxial materials when the films are thin. In such cases it is energetically favorable for the thin film to adopt an atomic arrangement that matches the substrate. Only after the film reaches a critical thickness is it favorable for defects to form and for the film to relax to its equilibrium structure. Since the nonmagnetic substrate crystal is chosen to provide a lattice match to the hexagonal ferrite and since the intermediary layer that is deposited on the substrate surface can be thin, it is possible for this intermediary layer to be a ferrite that is not normally a spinel.

Of the various ferrites that could possibly serve as an intermediary layer, lithium ferrite is particularly attractive. Among other attributes, lithium ferrite is a spinel and has a lattice constant very near the value required to match barium hexaferrite. Thus, lithium ferrite closely resembles the S block of barium hexaferrite.

EXAMPLES

In a first example, a MIGS (magnesium indium gallium oxide spinel) substrate was prepared. This substrate was cut from a single crystal of MIGS that had been grown from a lead oxide-boron oxide flux by the slow-cooling method. The lattice constant of that particular crystal was not measured; however, X-ray diffraction measurements of another sample from that batch determined that the lattice constant was 8.329 angstrom. This corresponds to a misfit of 0.06 percent relative to barium hexaferrite.

The substrate was cut from the flux-grown crystal so that the surface of the substrate was parallel to the (111) plane to within a few tenths of a degree. The substrate was then lapped and polished by standard methods, similar to those employed in the preparation of GGG substrates, to provide a damage-free surface of a quality referred to in the art as epi-finish.

An epitaxial film of lithium ferrite was grown on the surface of the substrate by the isothermal vertical dipping method of LPE (liquid phase epitaxy). This method is known in the art. The LPE solution consisted of lead oxide and boron oxide as solvent and lithium carbonate and iron oxide as solute, all contained in a platinum crucible. (At the temperatures used, the lithium carbonate decomposes into lithium oxide by evolution of carbon dioxide.) The composition of the LPE solution at the time the film was grown was approximately the following: lead oxide—909.99 gram; boron oxide—9.80 gram; lithium carbonate—4.00 gram; iron oxide—121.25 gram. The iron oxide was in the form of hematite.

The composition of the LPE solution is not known exactly because of two factors that are well known in the art. The first and principal factor is that there is continuous evaporation of lead oxide. Over the course of the weeks or months that the LPE solution is used, there may be a significant loss of lead oxide. The exact loss depends upon the temperature of the solution and its composition. To some extent the loss of lead oxide can be accommodated by changing the temperature used for film deposition. Eventually, however, it is necessary to add lead oxide to make up for the loss. The amount to be added is estimated from observation of the level of the solution in the crucible and from observed changes in film deposition characteristics. The second factor that produces uncertainty in the solution composition is the small amount of material that is removed from the solution each time a film is deposited. Although this effect is small, it can become significant if many films are deposited. When this occurs, it is possible to replenish the solution by adding appropriate amounts of the film constituents.

When the LPE solution was held overnight at 859° C., after previously being at a high enough temperature to dissolve any solids, a few crystals were found to have grown on the surface of the solution. X-ray diffraction showed that these crystals were lithium ferrite having a lattice parameter of 8.3341 angstrom After the LPE solution was brought to a higher temperature (939° C.) and stirred to assure the dissolution of any solids, the solution was brought to thermal equilibrium at a temperature of 855° C. and the MIGS substrate, held by a platinum wire, was dipped into the solution to deposit an epitaxial film of lithium ferrite by the process of vertical dipping. The total deposition time was five minutes. After deposition, the sample was cleaned in hot, dilute acetic acid.

Except for the areas near the platinum wire, the lithium ferrite film was smooth but with some hillocks. The film was transparent and red in color. From the intensity of the color and from the transparency, the film thickness was estimated to be between 0.5 and 1 micrometer.

The substrate with the lithium ferrite film was then dipped into another crucible for epitaxial deposition of barium hexaferrite by the isothermal vertical dipping method of LPE. The composition of the LPE solution was the following: barium carbonate—351.10 gram; boron oxide—70.75 gram; iron oxide—84.41 gram. The actual composition at the time the film was grown may have been very slightly different because of the removal of small amounts of material during prior film depositions. Unlike the lithium ferrite solution, however, volatility is not a problem with this solution. As in the case of the lithium ferrite, the crucible was made of platinum. The film deposition was carried out for 15 minutes at a temperature of 924° C. after completion of a higher temperature soak to assure complete dissolution of all solids.

After LPE growth of the barium hexaferrite film, the sample was cleaned in hot, dilute acetic acid. Examination showed that areas away from the platinum wire were free of the hexagonal islands, hexagonal scales, and growth terraces seen in hexagonal ferrite films grown directly on nonmagnetic substrates. However, the film surface had many rounded hillocks. The film was black and reflective, an appearance typical of bulk ferrite crystals. However, under intense illumination in a microscope, the film was found to be transparent and deep red in color. From these observations the film thickness was estimated to be a few micrometers.

An abrasive was used to remove the hexagonal and lithium ferrite films from one face of the substrate. After this, a diamond saw was used to cut a small piece from an area that had not been close to the platinum wire. This small piece, thus, consisted of MIGS substrate with the hexagonal ferrite film and the lithium ferrite intermediary transition layer on one face. This piece was used for ferromagnetic resonance measurements.

Ferromagnetic resonance absorption was measured by placing the small piece of the sample in a rectangular metal waveguide and monitoring the r.f. power transmitted through the waveguide as the frequency was swept over a range of several GHz. During this measurement, a d.c. magnetic field of 7.6 KOe was applied normal to the surface of the film. The resonance absorption peak was found to have a center frequency of 55 GHz and a full width of 48 Oe at half the maximum power.

This 48 Oe value is the actual measured value and is, therefore, significantly less than the value reported by Dotsch. The 7.6 KOe value of applied field implies that the internal field contribution from the hexagonal ferrite is 12.0 KOe since 19.6 KOe is the total field required for resonance at 55 GHz. Thus, the internal field contribution is in better agreement with the known values for barium hexaferrite than is the value found by Dotsch. Significantly, this indicates that the desired high value of anisotropy field is not reduced from its intrinsic value.

In a second example, materials and procedures were similar to those of the first. Since about one month had elapsed since the sample of the first example had been prepared, some lead oxide was added to the lithium ferrite LPE solution to compensate for evaporative losses. The lithium ferrite intermediary transition layer was deposited at 834° C. for 3 minutes. The growth rate seemed somewhat higher than in the first example since the film grown in this 3 minute period appeared to be of about the same thickness as the 5 minute deposition in the first example.

The epitaxial barium hexaferrite film was deposited at 917° C. for 60 minutes. The hexagonal ferrite film had rounded hillocks similar to those in the first example. X-ray diffraction confirmed the M-type hexagonal ferrite structure of the film. A large piece of this sample was sent to an independent laboratory (U.S. Army ERADCOM) where measurements were made of the ferromagnetic resonance linewidth and where the sample was examined with a scanning electron microscope. Their results showed that the film was approximately 10 micrometers thick and the surface was very smooth and almost featureless over an area approximately 0.6 mm by 0.8 mm. There was no evidence of islands, scales, steps, terraces or other similar structures. The resonance peak was 50 Oe wide at 56 GHz for the 0.6 mm by 0.8 mm piece.

This second example shows that very smooth surfaces can be obtained on the epitaxial hexagonal ferrite films.

In a third example, the materials and procedures were similar to those of the first example. The MIGS substrate was prepared from a different batch of flux-grown crystals for which the spinel lattice constant was 8.2974 angstrom. The lithium ferrite intermediary layer was grown several months prior to that of the first example. At this earlier time, the lead oxide content of the LPE solution would have been higher since less evaporation would have occurred. The lithium ferrite film was deposited at 789° C. for 5 minutes producing a film similar in appearance to those of the other examples.

A hexagonal ferrite epitaxial film was then deposited from an LPE solution consisting of: lead oxide—87.47 gram; strontium carbonate—57.86 gram; boron oxide—17.58 gram; iron oxide—26.72 gram. This LPE solution produces films of lead-substituted strontium hexaferrite. The film was deposited at 910° C. for 11 minutes. Areas not too close to the platinum holding wire were quite smooth. Except for a few isolated hexagonal hillocks or hexgonal steps, these areas were remarkably free of hexagonal morphological features. There was a slight rolling texture to the surface. These surfaces are much smoother and more uniform than those of films deposited directly on MIGS substrates. However, ferromagnetic resonance measurements showed that the linewidth was a few hundred Oe. This large value of linewidth may be due to nonuniform substitution of lead for strontium.

83E51

This third example shows that a hexagonal ferrite other than barium hexaferrite (in this case, lead substituted strontium hexaferrite) can be grown as epitaxial film on top of a lithium ferrite intermediary transition layer.

What is claimed is:

1. A composition, comprising:
   a single crystal substrate of a nonmagnetic material lattice matched to a selected hexagonal ferrite;
   a single crystal film of said selected hexagonal ferrite disposed on said substrate; and
   a single crystal film of a second ferrite interposed between said substrate and said single crystal film of hexagonal ferrite, wherein said second ferrite is not a hexagonal ferrite.

2. The composite of claim 1 wherein said hexagonal ferrite is barium hexaferrite, strontium hexaferrite, lead hexaferrite or a hexaferrite formed by substitutions among barium, strontium and lead.

3. The composite of claim 1, wherein said substrate is of nonmagnetic spinel or magnesium oxide.

4. The composite of claim 3 wherein said film of hexagonal ferrite and said film of a second ferrite are on a selected surface of said substrate, and wherein said selected surface is oriented substantially parallel to a (111) plane of said substrate.

5. The composite of claims 3 or 4 wherein said second ferrite is a spinel ferrite.

6. The composite of claims 3 or 4 wherein said second ferrite is lithium ferrite.

7. The composite of claims 3 or 4 wherein said nonmagnetic spinel is magnesium gallium oxide spinel, magnesium indium-gallium oxide spinel, magnesium aluminum oxide spinel or zinc gallium oxide spinel.

8. The composite of claim 1, wherein said substrate is of beta-alumina.

9. The composite of claim 8, wherein said film of hexagonal ferrite and said film of a second ferrite are on a selected surface of said substrate, and wherein said selected surface is oriented substantially parallel to a (00.1) plane of said substrate.

10. The composite of claims 8 or 9 wherein said second ferrite is a spinel ferrite.

11. The composite of claim 10, wherein said spinel ferrite is lithium ferrite.

12. The composite of claim 1, wherein said single crystal films of hexagonal ferrite and a second ferrite are formed by liquid phase epitaxial deposition.

13. A method for preparing single crystal films of a selected hexagonal ferrite, comprising:
   providing a single crystal nonmagnetic substrate lattice matched to said selected hexagonal ferrite;
   depositing a single crystal film of a second ferrite on said substrate surface; and
   depositing a single crystal film of said selected hexagonal ferrite on said single crystal film of a second ferrite, wherein said second ferrite is not a hexagonal ferrite.

14. The method of claim 13, further comprising:
   depositing said single crystal films of hexagonal ferrite and a second ferrite by liquid phase epitaxial deposition.

* * * * *

UNITED STATES PATENT AND TRADEMARK OFFICE
CERTIFICATE OF CORRECTION

PATENT NO. : 4,624,901
DATED : November 25, 1986
INVENTOR(S) : Howard L. Glass

It is certified that error appears in the above-identified patent and that said Letters Patent are hereby corrected as shown below:

Claim 1, line 40, please change "composition" to read --composite--.

Column 4, line 47, please place a period (.) after "atoms".

Column 5, line 6, please change "Anisotrophy" to read --Anisotropy--.

Column 6, line 4, please place a period (.) after "angstrom".

Column 9, line 37, please place a period (.) at the end of the sentence.

Signed and Sealed this

Twenty-first Day of April, 1987

Attest:

DONALD J. QUIGG

Attesting Officer

Commissioner of Patents and Trademarks